(12) United States Patent
Hantschel et al.

(10) Patent No.: US 7,082,684 B2
(45) Date of Patent: Aug. 1, 2006

(54) INTERMETALLIC SPRING STRUCTURE

(75) Inventors: Thomas Hantschel, Menlo Park, CA (US); Brent S. Krusor, Fremont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 10/912,418

(22) Filed: Aug. 4, 2004

(65) Prior Publication Data

US 2006/0030066 A1   Feb. 9, 2006

(51) Int. Cl.
*H01R 43/16* (2006.01)
(52) U.S. Cl. .................................................. 29/874
(58) Field of Classification Search ............ 29/825, 29/842–844, 874, 876–877
See application file for complete search history.

(56) References Cited

U.S. PATENT DOCUMENTS

| | | | |
|---|---|---|---|
| 3,842,189 A | 10/1974 | Southgate | |
| 3,952,404 A | 4/1976 | Matunami | |
| 4,189,342 A | 2/1980 | Kock | |
| 5,280,139 A | 1/1994 | Suppelsa et al. | |
| 5,613,861 A | 3/1997 | Smith et al. | |
| 5,665,648 A | 9/1997 | Little | |
| 5,848,685 A | 12/1998 | Smith et al. | |
| 5,914,218 A | 6/1999 | Smith et al. | |
| 5,944,537 A | 8/1999 | Smith et al. | |
| 5,979,892 A | 11/1999 | Smith | |
| 6,184,065 B1 | 2/2001 | Smith et al. | |
| 6,184,699 B1 | 2/2001 | Smith et al. | |
| 6,213,789 B1 | 4/2001 | Chua et al. | |
| 6,252,175 B1 | 6/2001 | Khandros | |
| 6,290,510 B1 | 9/2001 | Fork et al. | |
| 6,827,584 B1 * | 12/2004 | Mathieu et al. | 439/66 |
| 2002/0013070 A1 | 1/2002 | Fork et al. | |
| 2003/0010615 A1 | 1/2003 | Fork et al. | |

FOREIGN PATENT DOCUMENTS

WO   WO 01/48870 A2   7/2001

\* cited by examiner

*Primary Examiner*—Javaid H. Nasri
(74) *Attorney, Agent, or Firm*—Bever, Hoffman & Harms, LLP; Patrick T. Bever (57) ABSTRACT

A spring structure in which the transition of a metal layer from a solid solution to an intermetallic compound is utilized either to bend a spring finger into a curved shape, or to increase the yield point of the spring finger. The spring finger has an anchor portion attached to a substrate, and a cantilever portion extending over the substrate surface. The metal layer forms at least a portion of the spring finger. The metal layer is initially formed as a solid solution including a primary and secondary elements that transform to an intermetallic compound upon annealing, thereby generating a bending force that causes the cantilever portion of the spring finger to bend relative to the substrate, and/or to increase the yield point of the bent cantilever portion. The metal layer is formed by plating and/or sputtering, and annealing is performed before and/or after release of the cantilever portion.

26 Claims, 7 Drawing Sheets

INTERMETALLIC SPRING STRUCTURE

FIELD OF THE INVENTION

This invention generally relates to spring structures for interconnecting integrated circuits, and more particularly to photo lithographically patterned spring structures formed from plated metal films.

BACKGROUND OF THE INVENTION

Photolithographically patterned, stress-engineered spring structures have been developed, for example, to produce low cost probe cards and to provide electrical connections between integrated circuits. A typical conventional spring structure is formed from a stress-engineered (a.k.a. "stressy") film intentionally fabricated such that its lower/upper portions have a higher internal tensile stress than its upper/lower portions. This internal stress gradient is produced in the stress-engineered film by layering different materials having the desired stress characteristics, or using a single material by altering the fabrication parameters. The stress-engineered film is patterned to form fingers that are secured to an underlying substrate either directly or using an intermediate release material layer. When the release material (and/or underlying substrate) is selectively etched from beneath a cantilever (free) portion of the spring finger, the cantilever portion bends away from the substrate due to a bending force generated by the internal stress gradient, thereby producing a curved spring finger that remains secured to the substrate by an anchor portion. Such spring structures may be used in probe cards, for electrically bonding integrated circuits, circuit boards, and electrode arrays, and for producing other devices such as inductors, variable capacitors, and actuated mirrors. Examples of such spring structures are disclosed in U.S. Pat. No. 3,842,189 (Southgate) and U.S. Pat. No. 5,613,861 (Smith), both being incorporated herein by reference.

Most spring structures of the type mentioned above are currently produced using sputter deposition techniques in which a stress-engineered thin film is sputter deposited while changing the sputtered composition or the process parameters (e.g., pressure and/or power) during the deposition process, and this sputter-deposition production method has proven reliable for generating suitable stress-engineered films in small batches. However, the mass production of low-cost spring structures by the sputter-deposition production method faces several obstacles. First, the equipment needed to perform sputter deposition is very expensive to purchase and maintain. Second, sputter-deposition production methods have proven complex in part due to the tendency for process parameters of the sputtering equipment to drift (change) over time during repeated sputter runs, which requires constant recalibration of the sputtering equipment. Further, localized differences in the process parameters within the sputter equipment can result in significant differences in the tip heights of spring structures formed during a particular sputter run, thereby yielding inconsistent and unpredictable results. Moreover, suitable sputter equipment that allows for high stress uniformity over large (i.e., greater than four inch diameter) wafers has not yet been produced.

One recently developed alternative to sputter-based fabrication techniques is the use of plating techniques during which process parameters are changed to produce the desired stress gradient. Such plating-based fabrication methods are attractive not only because of the much lower equipment cost, but also because plating can be reliably scaled to large substrate sizes. However, although plating methods facilitate the fabrication of plated films exhibiting internal stress gradients, the attainable stress values in the compressive region of the stress-engineered film are relatively low, and plated stress-engineered films often exhibit weak adhesion to the underlying substrate.

What is needed is a highly reliable and repeatable method for fabricating spring structures that exhibit the relatively high tip heights of sputtered, stress-engineered spring structures, but avoids the associated high manufacturing expense and complexity.

SUMMARY OF THE INVENTION

The present invention is directed to a spring structure in which, instead of an induced stress gradient, the transition of a metal layer from an amorphous solid solution to an intermetallic compound is utilized either to bend a spring finger away from an underlying substrate, or to increase the yield point of a previously bent spring finger. The spring finger includes an anchor portion attached to a surface of the substrate, and a cantilever portion extending over the substrate surface. The metal layer forms at least a portion of the spring finger (i.e., either forming the spring core, or formed as a coating over a previously formed spring core). The metal layer is initially formed as an amorphous solid solution including a primary element (e.g., nickel (Ni) or copper (Cu)) and one or more secondary (Intermetallic Materials (IM) elements, such as phosphorous (P), boron (B), silicon (Si), Tin (Sn), aluminum (Al), zirconium (Zr), gold (Au), palladium (Pd) and indium (In)). The spring finger/metal layer is/are then annealed at a predetermined maximum annealing temperature that transforms the metal layer from the solid solution to an intermetallic compound, which causes the metal layer to generate a bending force that either bends the cantilever portion of the spring finger relative to the substrate (e.g., such that a tip of the spring finger is moved away from the substrate), or acts to increase the yield point of the spring finger. Because the bending and/or increased yield point is generated by the phase transformation of the intermetallic material, instead of an induced internal stress gradient, the metal layer (and, hence, the spring finger) can be formed using low cost plating procedures that employ a single plating bath and fixed process parameters, thereby greatly simplifying the fabrication process and reducing the fabrication cost relative to sputter-based fabrication techniques. Furthermore, the bending and/or increased yield point associated with the intermetallic material allows the use of relatively low-stress plated spring materials that exhibit higher adhesion to the underlying substrate and are typically much easier to produce than highly compressive stress-engineered plated films. Moreover, the annealed (intermetallic) metal layer "freezes" the resulting spring finger curvature for all subsequent operating temperatures that are at or below the maximum annealing temperature (provided the spring finger is subjected to forces that are within the spring finger's elastic range). Accordingly, the present invention provides a highly reliable, repeatable, and relatively inexpensive method for fabricating spring structures.

According to an aspect of the invention, the metal layer may be formed using either electroplating or electroless plating techniques. In one embodiment, a release layer (e.g., Titanium) is formed on an upper surface of the substrate, and a seed layer (e.g., Gold or Nickel) is formed on the release layer (or on the substrate). The metal layer is then plated onto the seed layer, and then etched to form individual spring fingers. Alternatively, a plating mask (e.g., photoresist) is formed over the seed layer and the metal layer is formed through the plating mask. In either case, a single plating bath and constant process parameters may be utilized to form the metal layer, thereby simplifying and reducing the cost of the production process. Alternatively, two or more plating baths may be utilized and/or the process parameters may be altered to enhance the bending process. For example, two or more plating baths may be utilize to selectively alter the concentrations of the IM element in various regions of the solid solution to produce a desired bending force. In one specific example, the IM element may be concentrated in the uppermost region of the metal layer to promote bending during the transition to the intermetallic phase.

In accordance with another aspect, the present inventors believe it possible to form the solid solution metal layer using sputter deposition techniques (i.e., instead of plating). Although sputtering typically requires more expensive fabrication tools, the inventors believe that the resulting metal layer may provide beneficial characteristics that justify the additional manufacturing costs.

Annealing is performed either before releasing the spring finger, after release, or both before and after release, and may be performed at different temperatures across a given wafer to produce spring structures having varying tip heights. Releasing the spring finger involves removing (e.g., etching) the sacrificial release material located under a portion of the spring finger, whereby an anchor portion of the spring finger remains attached to the substrate by a retained section of the release material, and the cantilever portion of the spring finger is separated from (e.g., extends over) the surface of the substrate. A full anneal (i.e., at the intermetallic phase transformation temperature) may be performed before release to produce spring structures with relatively low tip heights upon subsequent release. Alternatively, the full anneal may be performed after release to produce spring structures with relatively high tip heights. In yet another embodiment, a relatively low temperature annealing process is performed before release to promote partial bending of the spring finger upon release, and then the full anneal is performed to complete the bending process and set the tip height of the springs. The full annealing temperature may be applied uniformly to all spring structures formed on a substrate (wafer), or various intermetallic phase transformation temperatures may be applied to different regions of the substrate to produce spring structures having various tip heights.

Due to the substantially balanced and, in some instances, unpredictable bending force generated during the intermetallic transformation, a spring finger formed in accordance with the methods described above may bend in a direction opposite to the desired bending direction. For instance, the intermetallic transformation bending force may pull the spring finger tip downward when an upward bending force is desired. Therefore, in accordance with another embodiment of the present invention, the spring structure fabrication method may be modified to include a structure for generating an initial bending force, thereby reliably providing the desired bending direction during subsequent release and/or anneal. Thus, although this initial bending bias may increase fabrication costs by requiring multiple plating baths, process parameter changes, and/or an additional sputter deposition process, the provision of the initial bending force may improve production yields, thereby reducing overall production costs.

In one embodiment, a spring structure exhibiting an initial bending force is produced using two plating baths having different concentrations of one or more IM elements to produce a spring finger having different layers that produce an unbalanced bending force during the intermetallic transformation. For example, the spring finger may be formed such that a relatively high concentration of the one or more IM elements is provided in the uppermost (or lowermost) regions of the metal layer, thereby decreasing (or increasing) the bending force generated in these regions during the intermetallic transformation, thereby generating a bending force resulting in the desired curvature.

In another embodiment, a spring structure exhibiting an initial bending force is produced with both a thin stress-engineered layer for providing the initial bending bias, and a metal layer that facilitates further bending of the spring finger through the transition to an intermetallic phase. The stress-engineered layer is generated using sputtering or plating while varying the process parameters to generate an internal stress gradient in the growth direction (i.e., such that the upper layers of the stress-engineered layer have a higher tensile stress than the lower layers), thereby generating an upward bending bias. Because the purpose of the stress gradient is to initiate the bending process, only a thin stress-engineered layer is required, thereby reducing the time and expense associated with manufacturing spring structures made entirely from stress-engineered material. After forming the stress-engineered metal layer (and before release), the metal layer is formed according to the methods described above. Because the intermetallic metal layer is less expensive to generate than the stress-engineered layer, the overall fabrication cost of the compound spring finger is greatly reduced.

In accordance with another embodiment of the present invention, the amorphous solid solution is coated (e.g., electroplated or electroless plated) onto a "core" spring finger after the spring finger is bent into its characteristic curved shape, and then annealed to from an intermetallic coating. The present inventors have found that intermetallic coatings, such as $Ni_3P$ and $Ni_3B$ on, for example, stressed-metal spring cores, can dramatically improve (increase) spring elasticity, when compared to stressed-metal springs that are uncoated or coated by non-intermetallic metals (e.g. Ni). This increased elasticity is due to an increased yield point of the spring finger that is attributed to the intermetallic coating, which forms a kind of "shrink wrap" around the spring core. In general, when a spring is compressed against a contacting surface, the spring plastically deforms when the peak stress exceeds the materials yield point. Hence, springs provided with the intermetallic coating formed in accordance with the present invention exhibit increased yield points, and will therefore perform better in high-force applications, such as pressure-contact interconnects or probe cards. It is also noted that the yield point of a material decreases with increasing temperature and creeping. Hence, by "freezing" the intermetallic coating at an anneal temperature that is greater than an expected operating temperature, springs including the intermetallic coating formed in accordance with the present invention avoid temperature-related changes to the yield point and creeping during normal operation. Further, in addition to increasing a spring's yield point, the intermetallic coatings formed in accordance with the present invention can serve several additional purposes, such as providing increased spring hardness and wear resistance, increased spring conductivity, and/or act as a diffusion barrier between metals (e.g. NiP as a diffusion barrier between Cu and Au).

In alternative embodiments, the spring core (i.e., the structure to be coated) can be produced using an intermetallic material, a non-intermetallic metal, a bimetallic structure, or a bimorph structure, and may be coated with another material before and/or after the intermetallic coating is applied. Experiments conducted by the present inventors have shown that is preferable to form the spring core out of a common material (e.g. Ni), release (bend) the spring core into a desired final shape, and then coat the spring core with the desired amorphous solid solution (e.g., NiP). Post-release coating is preferable because, in order to achieve the required degree of spring curling with minimal processing, the spring core must be as thin as possible. Furthermore, a cost-efficient, reliable stress-gradient process is often easier to achieve with non-intermetallic materials. The subsequent annealing transforms the amorphous solid solution into the intermetallic coating. Intermetallic coatings in the range 0.1 to 20 μm were found to provide beneficial characteristics. In alternative embodiments, a stack of spring coatings were used in addition to the intermetallic coating, such as a Ni spring core surrounded by Ni+Au or Cu+Ni+Au, and overcoated with a NiP or NiB intermetallic coating.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 1:
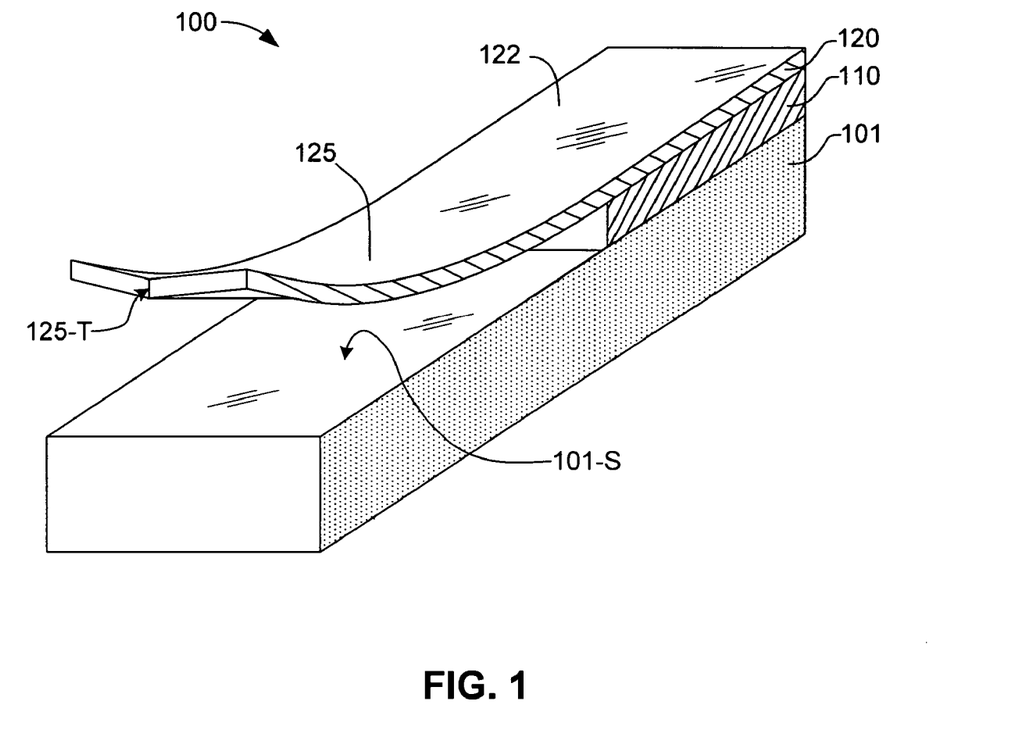
FIG. 1 is perspective view showing a spring structure formed in accordance with an embodiment of the present invention.

FIG. 1 is a perspective view depicting an exemplary spring structure 100 produced in accordance with an embodiment of the present invention. Spring structure 100 generally includes a spring finger 120 that is attached to a substrate 101 by way of an optional anchor pad 110. Spring finger 120 includes an anchor portion 122 that is attached to a surface 101-S of substrate 101 by way of optional anchor pad 110, and a curved cantilever portion 125 that extends from anchor portion 122 over surface 101-S. A tip 125-T of spring finger 120 is located at a "free" (i.e., unsupported) end of cantilever portion 125. In one embodiment, optional anchor pad 110 is formed using a material that can be selectively etched from beneath curved cantilever portion 125 of spring finger 120 during a release process.

Figure 2:
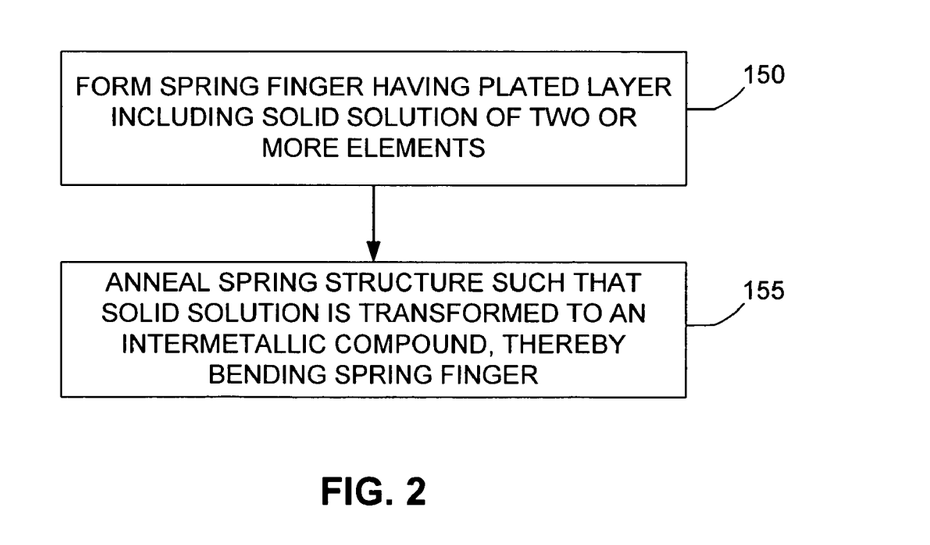
FIG. 2 is flow diagram showing a simplified method for producing the spring structure of FIG. 1 in accordance with another embodiment of the present invention.

FIG. 2 is a flow diagram showing a simplified fabrication method for producing spring finger 100 according to an embodiment of the present invention. In general, the novel method includes forming spring finger 120 such that it includes at least one metal layer made up of least one primary element (i.e., a metal such as nickel (Ni) or copper (Cu)), and one or more secondary "Intermetallic Material" (IM) elements, such as boron (B), phosphorous (P), silicon (Si), Tin (Sn), aluminum (Al), zirconium (Zr), gold (Au), palladium (Pd) and indium (In), that are suspended in an amorphous solid solution (block 150). Spring finger 120 is then annealed at a predetermined maximum annealing temperature that transforms the metal layer from the solid solution to an intermetallic compound (e.g., $Ni_3B$ or $Ni_3P$), which causes the metal layer to generate a bending force that either bends cantilever portion 125 relative to substrate 101 (e.g., such that tip 125-T moves away from substrate surface 101-S), and/or increases the resilience of cantilever portion 125 (block 155). In addition to Ni+P and Ni+B intermetallic compounds other exemplary Ni-based intermetallics include Ni+Si, Ni+Sn, Ni+Al, and Ni+Zr, and exemplary Cu-based intermetallics include Cu+B, Cu+P, Cu+Sn, Cu+Au, Cu+Al, and Cu+In. Because the bending/increased resilience is generated by the phase transformation of the metal layer formed in spring finger 125, instead of an induced internal stress gradient, the metal layer (and, hence, spring finger 120) can be formed using low cost plating procedures that employ a single plating bath and fixed process parameters, thereby greatly simplifying the fabrication process and reducing the cost over sputtered stress-engineered films. Furthermore, the relatively low-stress metal layer exhibits higher adhesion to substrate 101, and is typically much easier to produce than highly compressive stress-engineered plated films associated with conventional plated spring structures. Moreover, the annealed (intermetallic) metal layer "freezes" the curvature of spring finger 120 for all subsequent operating temperatures that are at or below the maximum annealing temperature (provided forces applied to spring finger 120 are within its elastic range). Accordingly, the present invention provides a highly reliable, repeatable, and relatively inexpensive method for fabricating spring structures.

According to an aspect of the present invention, spring finger 120 may be formed entirely by a single metal layer, as depicted in FIG. 1 and in the exemplary embodiments described below with reference to FIGS. 3(A) through 7. In contrast, one or more transformed metal layers may be selectively combined with other structures to form spring finger 120, as set forth in the various embodiments described below with reference to FIGS. 8 through 12.

Figure 3A:
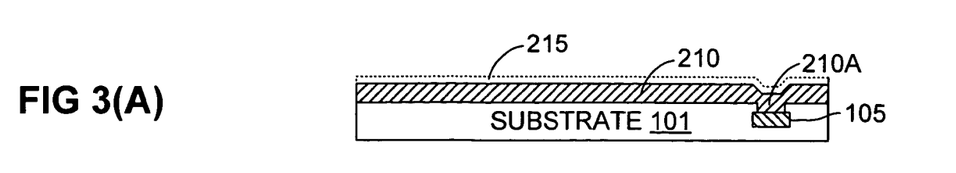
FIGS. 3(A), 3(B), 3(C), 3(D), 3(E), 3(F), 3(G), 3(H) and 3(I) are cross-sectional side views illustrating a method for producing the spring structure of FIG. 1 in accordance with a specific embodiment of the present invention.
Figure 3B:
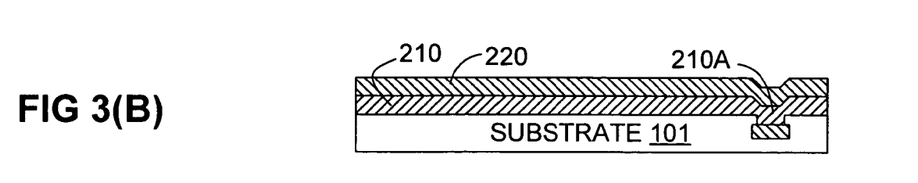
Figure 3C:
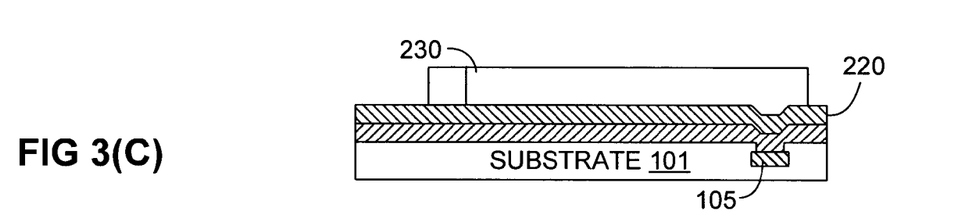
Figure 3D:
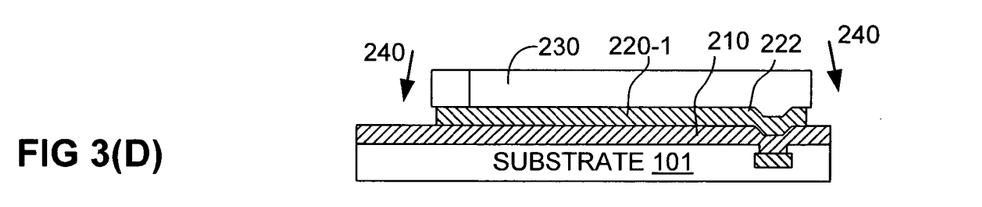
Figure 3E:
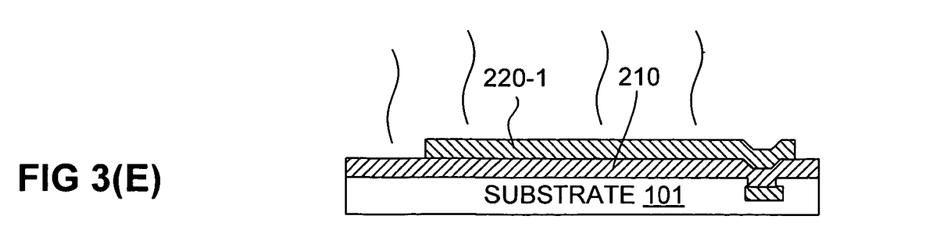
Figure 3F:
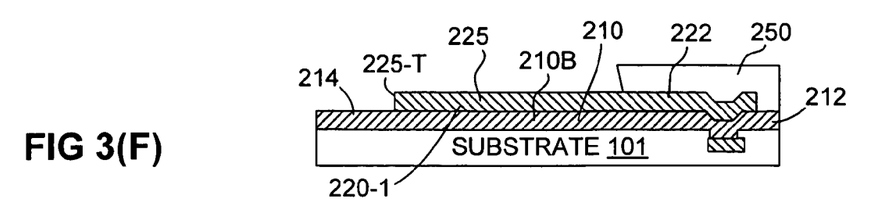
Figure 3G:
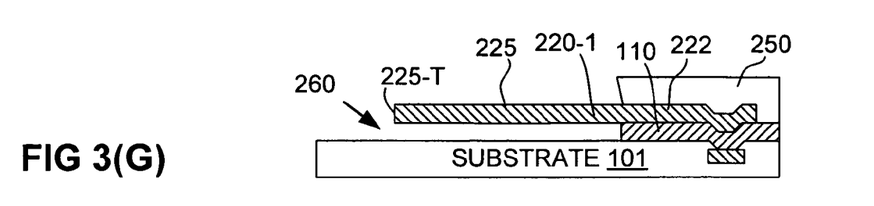
Figure 3H:
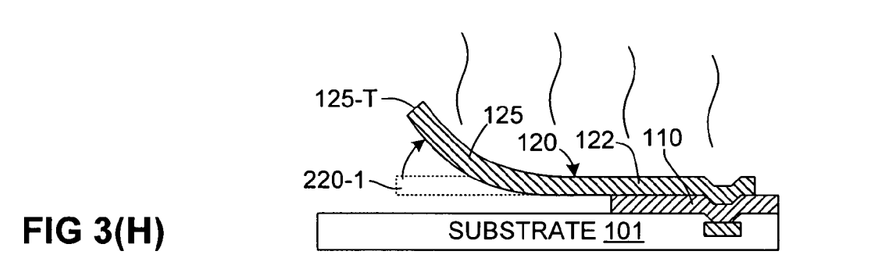
Figure 3I:
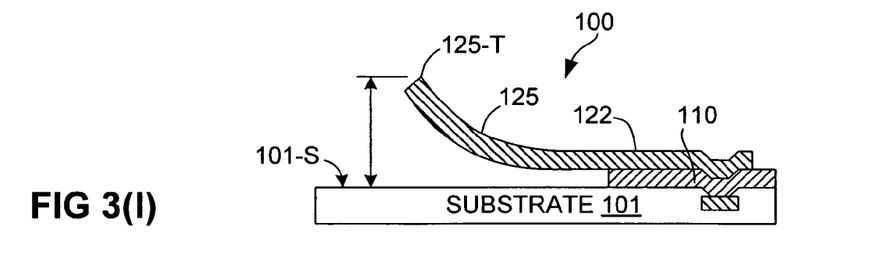

FIGS. 3(A)–3(I) and 4 depict a method for fabricating spring structure 100 according to a first specific embodiment of the present invention. FIGS. 3(A)–3(G) and 4 depict an exemplary process for forming a spring finger including a metal layer that comprises an amorphous solid solution of two or more selected elements in accordance with block 150 of FIG. 2, and FIG. 3(H) depicts an annealing process corresponding to block 155 of FIG. 2. As described in additional detail below, the specific processes depicted in FIGS. 3(A) to 3(I) are subject to several variations, and therefore the specific sequence depicted in these figures is not intended to limit the appended claims unless otherwise specified.

Referring to FIG. 3(A), the fabrication method begins with the formation of a conductive release material layer 210 over substrate 101, and the deposition of a plating seed layer 215 onto release material layer 210. Substrate 101 includes a contact pad or metal via ("contact pad") 105 that is coupled by an associated interconnect network to provide electrical access to the finished spring structure.

In one embodiment, release material layer 210 is titanium (Ti) that is sputter deposited onto substrate 101 to a thickness of approximately 50–200 nm or greater. Titanium provides desirable characteristics as a release material layer due to its plasticity (i.e., its resistance to cracking). Other release materials having the beneficial plastic characteristics of titanium may also be used. In other embodiments, depending on the subsequently formed metal layer, release material layer 210 may include another metal, such as Cu, Ni, aluminum (Al), zirconium (Zr), or cobalt (Co). Release material layer 210 may also be formed using Silicon (Si). Further, two or more release material layers can be sequentially deposited to form a multi-layer release structure. In yet another possible embodiment, any of the above-mentioned release materials can be sandwiched between two non-release material layers (i.e., materials that are not removed during the spring metal release process, described below).

Optional seed layer 215 (e.g., gold (Au) or Ni) is formed on release layer 210 according to known techniques. In one embodiment, seed layer 215 is a layer of Au having a thickness of 50 nm or greater that is sputtered onto Ti-based release layer 210.

FIG. 3(B) shows a metal layer 220 formed on release material layer 210. According to an embodiment of the invention, metal layer 220 is plated over release layer 210 or optional seed layer 215 (shown in FIG. 3(A)) in a manner that forms a solid solution including a primary element (e.g., Ni or Cu) and one or more secondary (IM) elements (e.g., P and/or B). Because there is no need to form an internal stress gradient in the metal layer, the plating process may be performed using either electroplating or electroless plating techniques using a single plating bath, and without changing process parameters during the deposition of the solid solution, thereby greatly simplifying the deposition process over techniques used to form stress-engineered films. NiP and NiB plating baths typically contain nickel chloride and/or nickel sulfate as source of Ni. In case of electroless NiP plating, sodium hypophosphate is typically used as the reducing agent and source of P. In case of electroless NiB plating, sodium borohydride is typically used as reducing agent and source of B. The bath operating temperature of electroless NiP and NiB is typically 65–95° C. Alternative reducing agents which can be used are dimethylamine borane and hydrazine. Bath additives such as complexants, pH-regulators, buffers, stabilizers, stress reducers and wetting agents are typically used. Electroplated NiP baths typically contain nickel chloride and/or nickel sulfate as source of Ni. Phosphoric acid and/or phosphorous acid are typically used as source of P. The bath typical operating temperature is 60–95° C. Bath additives such pH-regulators, buffers, brighteners, stress reducers and wetting agents are typically used. The typical thickness of plated springs is 0.3–2.5 µm.

In accordance with an alternative embodiment, metal layer 220 may be formed using sputter deposition techniques in which the process parameters are set to produce the desired solid solution. Although sputtering typically requires more expensive fabrication tools and takes more time to perform, the inventors believe that the resulting sputtered metal layer may provide beneficial characteristics that justify the additional expense. Moreover, as discussed in additional detail below, the sputtering process parameters may be altered to produce a stress gradient in the metal layer, thereby inducing an upward bending bias that causes the subsequently formed spring finger to bend away from substrate 101 upon release.

Figure 4:
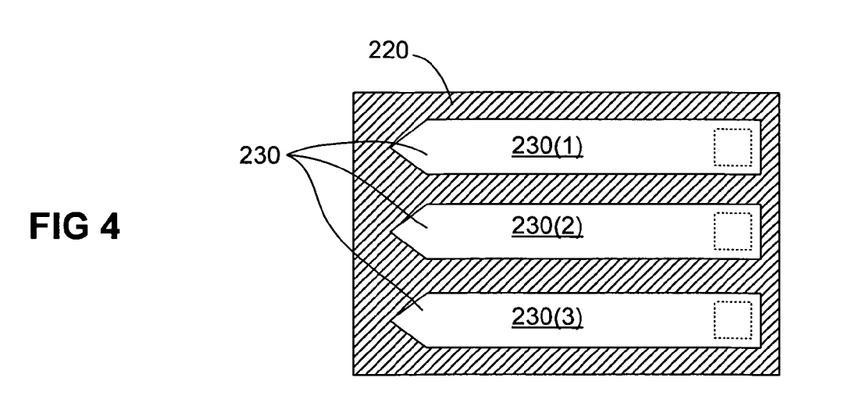
FIG. 4 is a top plan view showing etch masks utilized in the process of FIGS. 3(C) and 3(D)

Referring to FIGS. 3(C) and 4, one or more elongated etch masks 230 (e.g., masks 230(1), 230(2) and 230(3), shown in FIG. 4) are then patterned (e.g., using photoresist) over selected portions of metal layer 220.

Next, as indicated in FIG. 3(D), exposed portions of metal layer 220 are etched using one or more etchants 240 to form an elongated spring finger 220-1 that is connected along its entire length to release material layer 210. In one embodiment, an anisotropic etching process is used (e.g., by reactive ion etching in flourine plasma or argon ion milling) that avoids undercutting spring finger 220-1. In other embodiments, isotropic etching can be used provided removal of release material located under spring finger 220-1 is minimized, particularly in regions located under an anchor portion 222 of spring finger 220-1. In one embodiment, isotropic etching may include a wet etching process using a nitric acid-based etchant to remove a NiB or NiP metal layer. Other specific etching procedures and etchants are known in the art. Accordingly, premature release of spring finger 220-1 is reliably avoided, which is particularly important in anchor portion 222. Etch mask 230 is then removed.

Referring to FIG. 3(E), an optional pre-release annealing process may be employed for various reasons. In one embodiment, this pre-release annealing process may be carried out at a temperature that transforms the metal layer of spring finger 120 from solid solution to an intermetallic compound. The transformed intermetallic compound would apply a bending force to spring finger 120, but spring finger would resist this bending force due to its connection to substrate 101 by way of release layer 210. This pre-release annealing process may be utilized when a relatively small tip height of the subsequently release spring finger is desired (i.e., due to relaxation of some of the bending force). As described in additional detail below, in another embodiment, a relatively low-temperature pre-release annealing process may be utilized to generate a small upward bending bias upon subsequent release. A post-release annealing process would then be performed to lift tip 125-T of spring finger 120 to a desired tip height.

Referring to FIG. 3(F), a release mask 250 (e.g., photoresist) is then formed over anchor portion 222 and adjacent portion 212 of release material layer 210, whereby a central portion 225 and a tip 225-T of spring finger 220-1 and surrounding sections (e.g., portion 214) of release material layer 210 are exposed.

FIG. 3(G) depicts a release procedure in which a release etchant 260 (e.g., a buffered oxide etch) is used to selectively remove the portions of the release layer exposed by release mask 250 (e.g., referring back to FIG. 3(F), peripheral portion 214 and a section 210B, which is located below central section 225 and tip 225-T). Note that release mask 250 prevents significant etching of the portion of release material located under anchor portion 222 of spring finger 220-1, which is retained as anchor pad 110. Note also that when spring finger 220-1 is formed using a single plating bath and without changing the process parameters (i.e., without an internal stress gradient), spring finger 220-1 undergoes little or no bending upon release, as depicted in FIG. 3(G). After the release process is completed, release mask 250 is removed.

FIG. 3(H) depicts a post-release annealing process whereby the spring finger 220-1 is heated to a predetermined maximum temperature that transforms the solid solution to an intermetallic compound, thereby generating a bending force that bends cantilever 125 of spring finger 220-1 away from substrate 101 (i.e., from the substantially straight spring finger 220-1 to the curved spring finger 120). Note that the bending force generated in anchor portion 222 is resisted by its adherence to substrate 101 via anchor pad 110. The post-release annealing process may be omitted when pre-release annealing (discussed above) is employed. Both post-release and pre-release annealing may be performed using hotplate or oven, and may be varied in different regions of a wafer to cause the various springs formed on that wafer to achieve different spring heights. For example, NiP spring fingers having a length of 400 μm, a width of 40 μm, and a thickness of 1.7 μm can be annealed at 200 to 400° C. for 1 to 10 min, which generates a curvature resulting in a tip height of 100 to 200 μm. The resulting spring structure 100 (shown in FIG. 3(I)) exhibits a curved cantilever portion 125 that maintains tip 125-T at a desired tip height H relative to surface 101-S of substrate 101. In effect, the curvature of spring structure 100 becomes "frozen" for all operating temperatures at or below the predetermined maximum temperature, thereby providing a highly reliable, repeatable, and relatively inexpensive process for fabricating spring structures. In other words, if spring structure is maintained at or below the maximum annealing temperature, and applied forces remain within the elastic range associated with spring finger 120, then tip height H remains substantially constant.

Figure 5A:
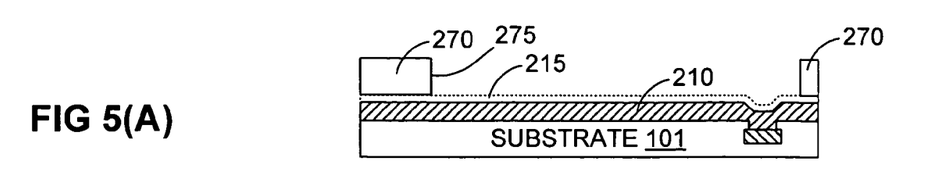
FIGS. 5(A), 5(B), 5(C), 5(D) and 5(E) are cross-sectional side views illustrating a method for producing the spring structure of FIG. 1 in accordance with another specific embodiment of the present invention.
Figure 5B:
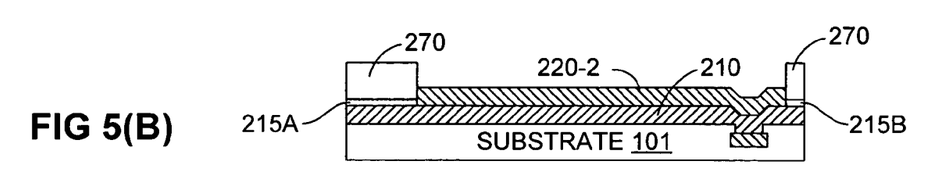
Figure 5C:
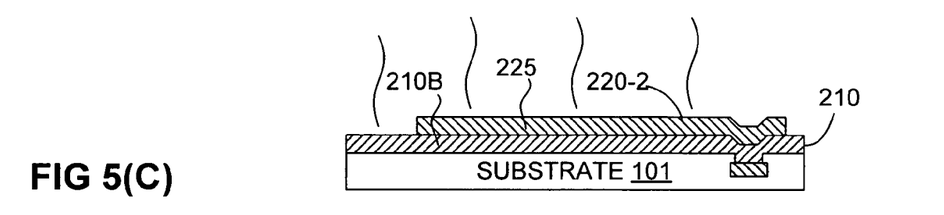
Figure 5D:
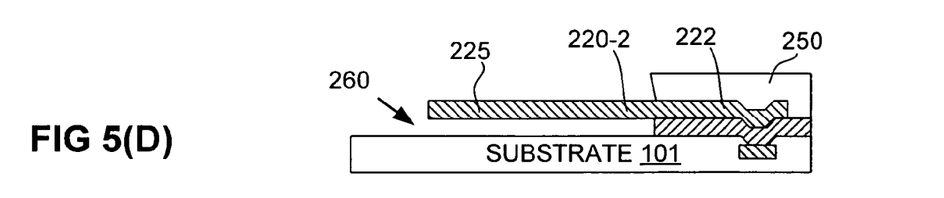
Figure 5E:
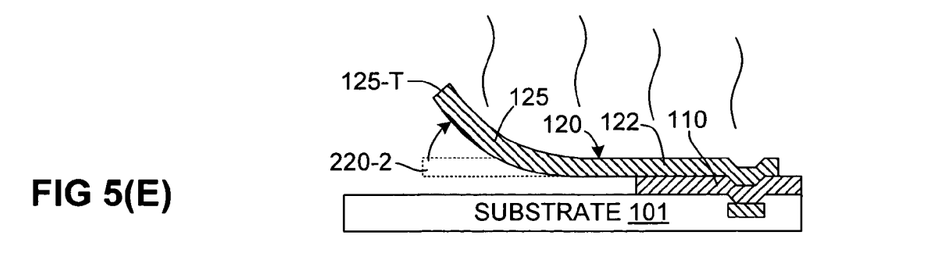

FIGS. 5(A) through 5(E) depict an alternative method for fabricating spring structure 100 in which a deposition (hard) mask is utilized to avoid the post-deposition etching process utilized in the first specific embodiment described above with reference to FIGS. 3(C) and 3(D). FIG. 5(A) depicts substrate 101 with release layer 210 and seed layer 215 formed in the manner described above with reference to FIG. 3(A). In addition, FIG. 5(A) shows a deposition (hard) mask 270 defining an elongated window 275 that exposes a corresponding region of seed layer 215. In effect, deposition mask 270 is substantially the negative of (opposite to) etch mask 220, which is shown in FIG. 4. Referring to FIG. 5(B), metal layer 220-2 is subsequently formed on release layer 210 by electroplating, electroless plating, or sputter deposition techniques. FIG. 5(C) shows spring finger 220-2 and underlying release layer 210 after the removal of the deposition mask and remaining sections of unused seed layer (e.g., seed layer portions 215A and 215B, shown in FIG. 5(B)). FIG. 5(C) also depicts heat waves indicating the optional pre-release annealing process described above. FIG. 5(D) depicts the release of spring finger 220-2 in a manner that is essentially identical to the release operation described above (i.e., using a release mask 250 and release etchant 260). Finally, as shown in FIG. 5(E), annealing is performed as described above to transform spring finger 220-2 from a solid solution to an intermetallic compound, thereby bending planar spring finger 220-2 into curved spring finger 120, thereby completing the fabrication of spring structure 100.

Figure 6:
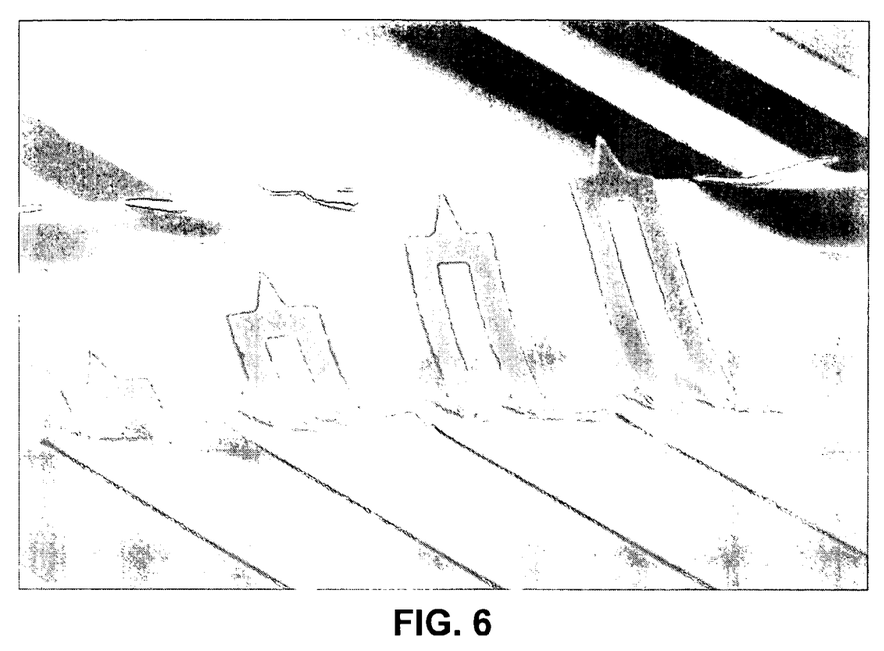
FIG. 6 is a photograph showing spring structures produced in accordance with the present invention.
Figure 7:
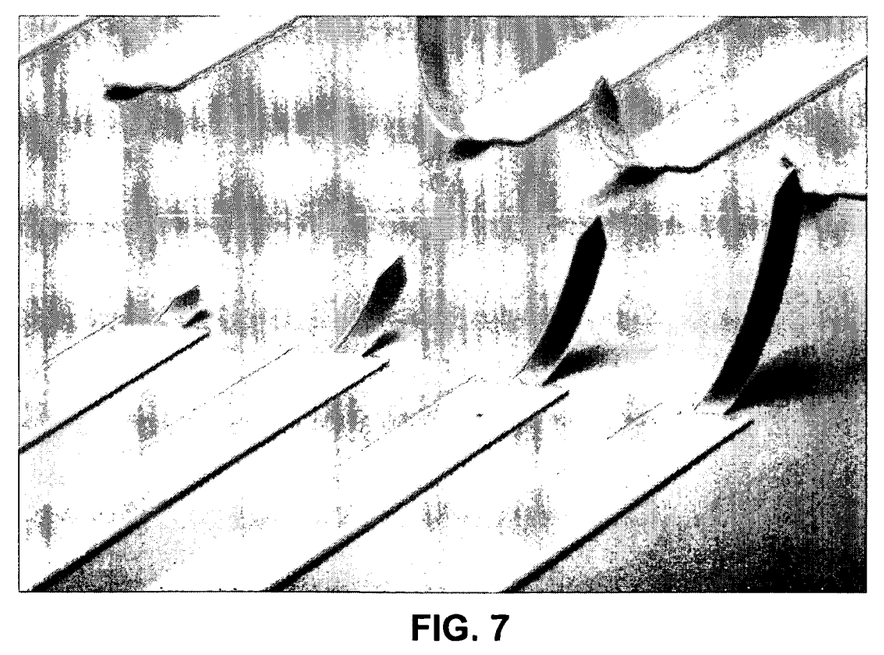
FIG. 7 is a photograph showing spring structures produced in accordance with the present invention.

FIGS. 6 and 7 depict actual spring structures generated in accordance with the fabrication methods described above. In particular, the prototypes shown in these figures were fabricated using electroless nickel-phosphor plating. First, a wafer with a Au seed layer was lithographically patterned, and then exposed to the plating bath. The wafer was plated until the desired beam thickness was reached. The spring structures of FIG. 6 include 2 μm thick spring structures (beams) plated in commercial bath, and the spring structures shown in FIG. 7 include 1.7 μm thick beams plated using a self-mixed electroless NiP bath. No process parameters were changed during either production process. Next, the resist was stripped, the remaining Au seed layer was etched, and then the beams were underetched (released). The entire wafer was then annealed at approximately 350° C. The release height increased dramatically at annealing temperatures above 300° C. due to the transformation to the intermetallic $Ni_3P$ phase. Note that this effect was observed for different commercial plating baths as well as for a self-mixed plating bath.

Although significant cost benefits are derived from the present invention due to the ability to generate spring fingers using a single plating bath, other beneficial characteristics may be achieved by utilizing two or more plating baths.

Figure 8:
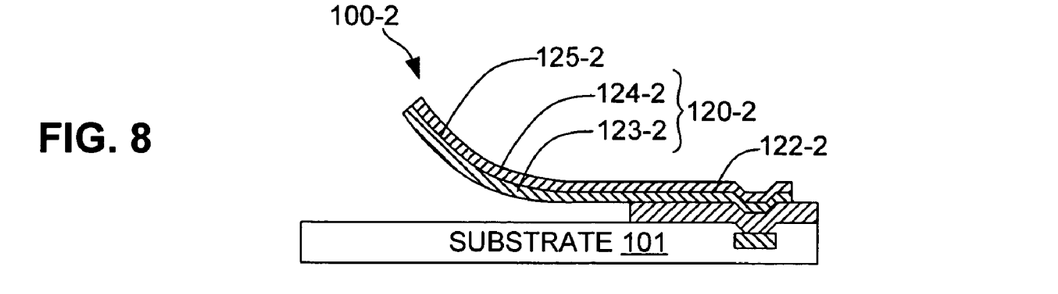
FIG. 8 is a cross-sectional side view showing a spring structure according to another embodiment of the present invention.

FIG. 8 is a cross-sectional side view showing a spring structure 100-2 including a spring finger 120-2 formed on a substrate 101 according to an exemplary embodiment utilizing two plating baths. In this example, two or more plating baths are utilize to selectively alter the concentrations of the IM element in a lower layer (first region) 123-2 and an upper layer 124-2 (second region) during the plating process. One reason for altering the IM element concentration in this manner may be to promote upward bending of cantilever portion 125-2 during the anneal process. For example, the amount of IM element (e.g., B or P in Ni) may be relatively high (e.g., 7 to 12%) in a first plating bath used to deposit the solid solution associated with lower layer 123-2, thereby minimizing the associated bending force generated in this region due to the increased amount of phase transition during annealing. In contrast, a second plating bath including a relatively low concentration (approximately 1 to 6%) of the IM element may be used to form upper layer 124-2, thereby maximizing the bending force generated in this region during the solid-solution-to-intermetallic-phase transformation. The resulting spring structure 120-2 thus exhibits the desired aggregate upward bending force due to the relatively low contraction of the upper layer during the phase transformation. In another alternative embodiment, a stress-reducing element (e.g., organo-sulfer compounds such as saccharin) that reduce an expansive bending force during the solid-solution-to-intermetallic-phase transformation may be added to one of the upper and lower plating baths, thereby producing the desired stress differential with the same IM concentration.

As suggested above, due to the substantially balanced and, in some instances, unpredictable bending force generated during the intermetallic transformation, a spring finger formed in accordance with the methods described above may bend in a direction opposite to the desired bending direction. For instance, the intermetallic transformation bending force may pull the tip of a given spring finger tip downward (toward the substrate) when an upward bending force (i.e., away from the substrate) is desired. By forming spring structures with an initial bending bias, the bending direction of the spring finger upon release and/or anneal becomes more reliable. For example, referring again to spring structure 100-2 (FIG. 8), by forming upper layer 124-2 such that it exerts a greater bending force than lower layer 123-2, spring finger 120-2 is reliably bent upward during the annealing process. Several additional spring structure fabrication methods are described below that are modified to generate an initial bending force in the fabricated spring structure.

Figure 9A:
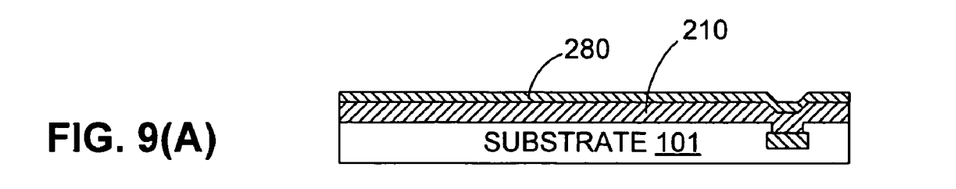
FIGS. 9(A), 9(B), 9(C), 9(D) and 9(E) are cross-sectional side views illustrating a method for producing a spring structure according to another specific embodiment of the present invention.
Figure 9B:
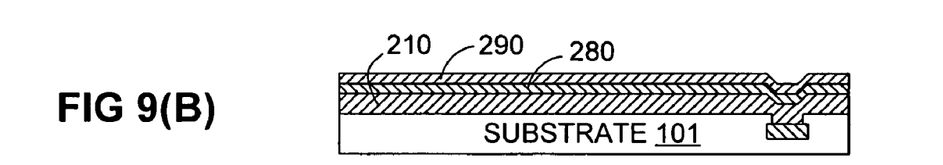
Figure 9C:
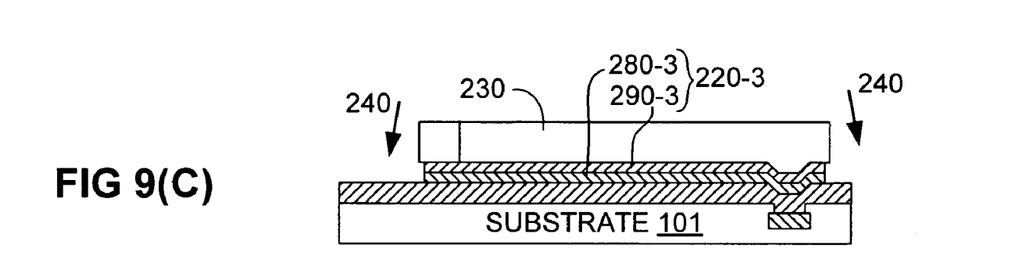
Figure 9D:
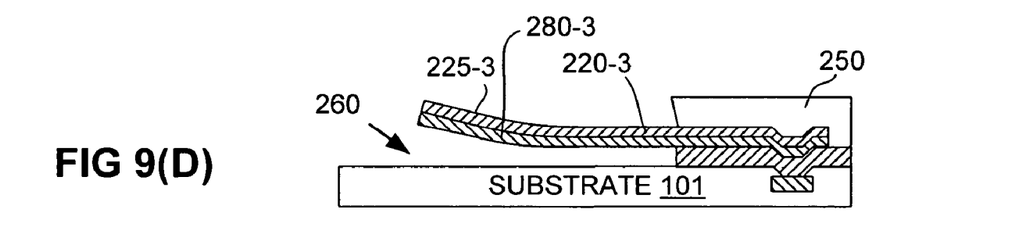
Figure 9E:
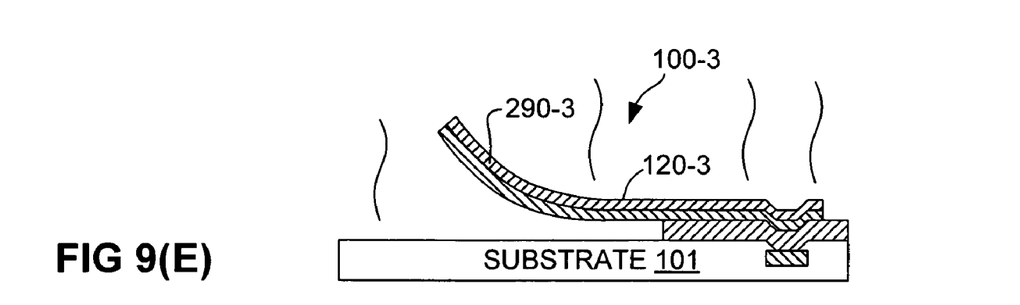

FIGS. 9(A) to 9(E) depict a modified method for fabricating a spring structure in which a stress-engineered layer is utilized to generate an initial bending force upon release of the spring finger. FIG. 9(A) depicts substrate 101 with release layer 210 and optional seed layer (not shown) formed in the manner described above with reference to FIG. 3(A), and a stress-engineered metal layer 280 formed on release layer 210. In one embodiment, stress-engineered layer 280 is formed by altering the process parameters (e.g., current density in electroplating) during a plating process to produce the desired stress gradient. In another embodiment, engineered layer 280 is formed by sputtering a metal film while altering the process parameters (e.g., sputter pressure) to produce the desired stress gradient. The fabrication of stress-engineered layers in either of these manners is well known in the art. Referring to FIG. 9(B), metal layer 290 is subsequently formed on stress-engineered layer 280 using the electroplating, electroless plating, or sputter deposition techniques described above. In one embodiment, metal layer 290 is formed by plating techniques and is substantially thicker than stress-engineered layer 280. FIG. 9(C) shows an etching process using etch mask 230 and one or more etchants 240 in the manner described above to produce a spring finger 220-3, which includes a stress-engineered layer portion 280-3 and a metal layer portion 290-3. FIG. 9(D) depicts the release of spring finger 220-3 in a manner that is essentially identical to the release operation described above (i.e., using a release mask 250 and release etchant 260). Note that cantilever portion 225-3 of spring finger 220-3 is bent slightly upward due to the bending force generated by stress-engineered layer portion 280-3. Finally, as shown in FIG. 9(E), annealing is performed as described above to transform metal layer portion 290-3 of spring finger 220-3 from a solid solution to an intermetallic compound, thereby generating an additional bending force that further bends spring finger 220-3, thereby forming spring finger 120-3 and completing the fabrication of spring structure 100. Although the initial bending bias generated by stress-engineered layer portion 280-3 may increase fabrication costs by requiring process parameter changes and/or the addition of a sputtering method, the provision of the initial bending force may improve production yields, thereby reducing overall production costs.

In addition to spring fingers formed with intermetallic compounds, the present inventors have also determined that forming intermetallic coatings on previously released spring fingers produces spring structures exhibiting superior elasticity and strength.

Figure 10:
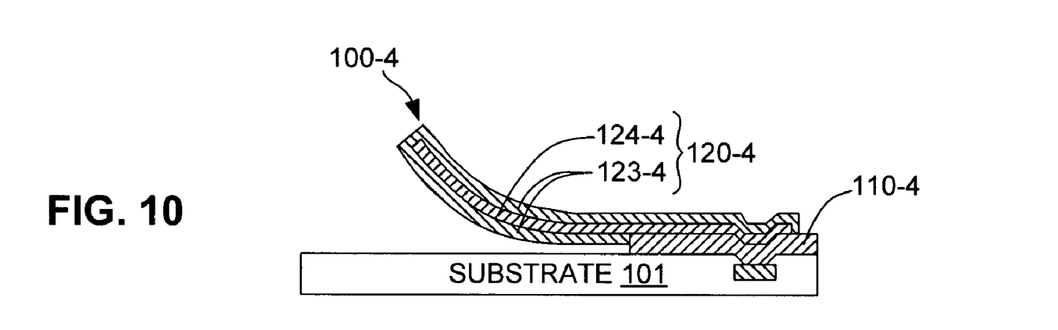
FIG. 10 is a side view showing a spring structure including an intermetallic coating according to another embodiment of the present invention.

FIG. 10 is a cross-sectional side view showing a spring structure 100-4 including a spring finger 120-4 and anchor pad 110-4 formed on a substrate 101 according to another exemplary embodiment of the present invention. In this example, spring finger 120-4 includes both a spring core 123-4 and an intermetallic coating 124-4. Spring core 123-4 is formed using any of the methods described above, and then released (i.e., bent into the desired curved shape). A suitable amorphous solid solution (e.g., NiP or NiB) is then coated (e.g., electroplated or electroless plated) onto all exposed surfaces of spring core 123-4. The coated spring is then annealed to transform the amorphous solid solution into intermetallic coating 124-4. The present inventors have found that intermetallic coatings 124-4, such as $Ni_3P$ and $Ni_3B$ on, for example, stressed-metal spring cores 123-4, dramatically improves (increases) the elasticity and yield point of the resulting spring structure, when compared to stressed-metal spring structures that are uncoated or coated by non-intermetallic compounds (e.g., pure Ni). This increased elasticity and yield point is attributed to the transformation of the amorphous solid solution to intermetallic coating 124-4, which acts as a kind of "shrink wrap" around spring core 123-4. In addition, intermetallic coatings such as $Ni_3P$ and $Ni_3B$ can serve to increase hardness, wear resistance and conductivity.

Research conducted by the present inventors supports the conclusion that intermetallic coating 124-4 significantly increases the elasticity of previously formed springs. Experiments conducted by the present inventors have shown that is preferable to form spring core 123-4 out of a stress-engineered non-intermetallic metal layer (e.g. Ni), to release (bend) spring core 123-4 into a desired final shape, and then to coat the spring core with the desired amorphous solid solution (e.g. NiP). In alternative embodiments, spring cores 123-4 produced using a stress-engineered (e.g., plated or sputtered) layer, an intermetallic compound layer, a bimetallic structure, or a bimorph structure can be improved by modifying these core structures with intermetallic coating 124-4. Post-release coating of spring core 123-4 is preferable because, in order to achieve the required degree of spring bending with minimal processing, spring core 123-4 should be as thin as possible. Furthermore, a cost-efficient, reliable stress-gradient process is often easier to achieve with non-intermetallic materials. In experiments conducted by the present inventors, 0.3 to 2.0 μm electroplated Ni spring cores were overplated after release with 0.1 to 20 μm of NiP by electroless plating. The as-deposited NiP solid solution was then transformed by annealing at 300° C. for 5–10 minutes to form crystalline intermetallic $Ni_3P$. Different temperatures and annealing times may be used in accordance with well known annealing practices. The inventors note that other phases of $Ni_xP_y$ may be formed as well during annealing. NiB has similar properties as NiP when used as coating 124-4.

Figure 11:
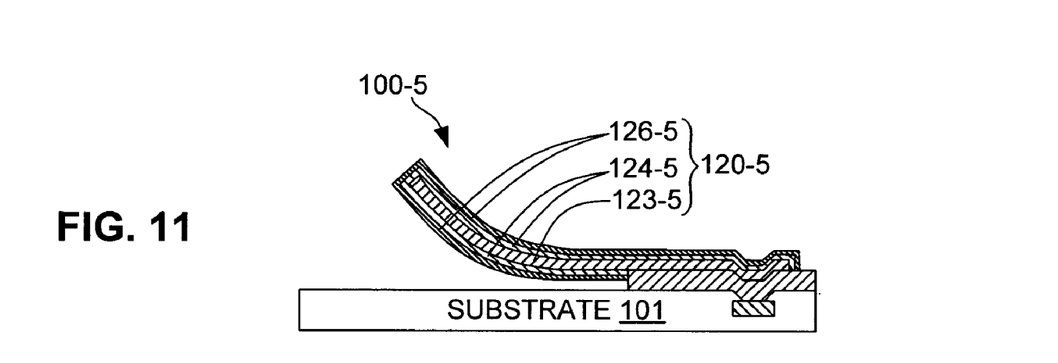
FIG. 11 is a side view showing another spring structure including an intermetallic coating according to another embodiment of the present invention.
Figure 12:
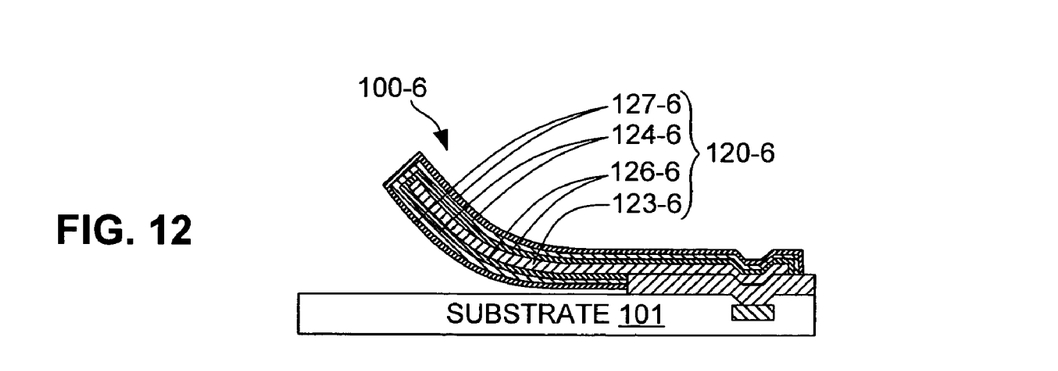
FIG. 12 is a side view showing yet another spring structure including an intermetallic coating according to another embodiment of the present invention.

In addition to the intermetallic coating, spring structures may benefit from one or more additional coating materials applied before and/or after applying the solid solution (metal layer) used to form the intermetallic coating. For example, as indicated in FIG. 11, a spring structure 100-5 includes a spring finger 120-5 made up of a spring core 123-5 and an intermetallic coating 124-5 that are formed in the manner described above, and in addition includes an additional, non-intermetallic coating 126-5 (e.g., one or more of Au, Ni, and Cu). In one embodiment, non-intermetallic coating 126-5 comprises a stack of spring coatings, such as Ni+Au or Cu+Ni+Au. In another embodiment, shown in FIG. 12, a spring structure 100-6 includes a spring finger 120-6 made up of a spring core 123-6 (e.g., Ni), a non-intermetallic coating 126-6 (e.g., Ni+Au or Cu+Ni+Au) formed on spring core 123-6, and an intermetallic coating 124-6 (e.g., $Ni_3P$ or $Ni_3B$) formed over non-intermetallic coating 126-6. An additional non-intermetallic coating 127-6 may be formed over intermetallic coating 124-6, with intermetallic coating 124-6 acting as a diffusion barrier between the metals of coatings 123-6 and 127-6 (e.g., $Ni_3P$ as a diffusion barrier between Cu and Au inner and outer coating layers). Additional alloying elements might be added to the coating layers (e.g., Ni—P—B, Ni—P—Cu).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A method for fabricating a spring structure including a spring finger mounted on a substrate, wherein the method comprises:

forming said spring finger including an anchor portion connected to the substrate and a cantilever portion extending from the anchor portion, wherein the spring finger includes a metal layer comprising a solid solution including a metal and at least one other element; and annealing the spring finger at a selected temperature such that the metal layer transforms from the solid solution to an intermetallic compound, and such that said transformation generates a bending force in said spring finger.

2. The method according to claim 1, wherein forming the spring finger comprises:

forming a release layer on the substrate; and forming the metal layer on the release layer.

3. The method according to claim 2, further comprising forming a seed layer on the release layer before forming the metal layer.

4. The method according to claim 2, further comprising:

forming an etch mask on the metal layer; and etching exposed portions of the metal layer, thereby forming said spring finger under the etch mask.

5. The method according to claim 4, further comprising releasing the cantilever portion of the spring finger by removing a portion of the release layer located between the cantilever portion and the substrate.

6. The method according to claim 5, wherein said annealing is performed before said releasing.

7. The method according to claim 5, wherein said annealing is performed after said releasing.

8. The method according to claim 2, further comprising:
forming a deposition mask over the release layer, the deposition mask defining an elongated window; and
forming the metal layer through the window of the deposition mask, thereby forming the spring finger.

9. The method according to claim 8, further comprising releasing the cantilever portion of the spring finger by removing a portion of the release layer located between the cantilever portion and the substrate.

10. The method according to claim 9, wherein said annealing is performed before said releasing.

11. The method according to claim 9, wherein said annealing is performed after said releasing.

12. The method according to claim 9, wherein said annealing includes a first annealing process at a first temperature performed before said releasing, and a second annealing process at a second temperature performed after said releasing.

13. The method according to claim 1, wherein forming the spring finger comprises forming said metal layer using one of an electroplating process and an electroless plating process.

14. The method according to claim 13, wherein forming the metal layer comprises depositing at least one of Cu and Ni, and at least one of P, B, Si, Sn, Al, Zr, Au, Pd and In.

15. The method according to claim 13, wherein forming the metal layer comprises utilizing a single plating bath containing said metal and said at least one other element, and maintaining said single bath at constant process parameters throughout formation of the metal layer.

16. The method according to claim 13, wherein forming the metal layer comprises utilizing a single electroplating bath containing said metal and said at least one other element, and varying the current density throughout formation of the metal layer.

17. The method according to claim 13, wherein forming the metal layer comprises utilizing a first bath to generate a first region of the metal layer, and a second bath to generate a second region of the metal layer, wherein a first concentration of said at least one other element in the first region differs from a second concentration of said at least one other element in the second region.

18. The method according to claim 1, wherein forming the spring finger comprises sputter depositing said metal layer.

19. The method according to claim 1, wherein forming the spring finger comprises:

forming a stress-engineered layer having an internal stress gradient; and
forming said metal layer on said stress-engineered layer.

20. The method according to claim 1,
wherein forming the spring finger comprises coating a spring core with said metal layer, and
wherein said annealing causes said metal layer to form an intermetallic coating over the spring core.

21. The method according to claim 20, further comprising, before coating with said metal layer, releasing the spring core such that the spring core bends into a desired curved shape.

22. The method according to claim 20, wherein the spring core comprises at least one of a non-intermetallic compound, an intermetallic compound, a bimetallic structure, and a bimorph structure.

23. The method according to claim 20, wherein said metal layer has a thickness in the range of 0.1 to 20 μm.

24. The method according to claim 20, further comprising coating the intermetallic coating layer with a non-intermetallic coating layer.

25. The method according to claim 20, further comprising coating the spring core with a non-intermetallic coating layer before coating with the metal layer.

26. A method for fabricating a spring structure including a spring finger mounted on a substrate, wherein the method comprises:

forming said spring finger including an anchor portion connected to the substrate and a cantilever portion extending from the anchor portion, wherein the spring finger includes a metal layer comprising a solid solution including a metal and at least one other element; and
annealing the spring finger at a selected temperature such that the metal layer transforms from the solid solution to an intermetallic compound,
wherein forming the spring finger comprises:
forming a release layer on the substrate;
forming the metal layer on the release layer;
forming an etch mask on the metal layer;
etching exposed portions of the metal layer, thereby forming said spring finger under the etch mask; and
releasing the cantilever portion of the spring finger by removing a portion of the release layer located between the cantilever portion and the substrate, and
wherein said annealing includes a first annealing process at a first temperature performed before said releasing, and a second annealing process at a second temperature performed after said releasing.

* * * * *